(12) United States Patent
Saitoh

(10) Patent No.: US 7,192,808 B2
(45) Date of Patent: Mar. 20, 2007

(54) SEMICONDUCTOR DEVICE HAVING A LEAD FRAME SMALLER THAN A SEMICONDUCTOR CHIP AND MANUFACTURING METHOD THEREFOR

(75) Inventor: Hiroshi Saitoh, Iwata-gun (JP)

(73) Assignee: Yamaha Corporation, Shizuoka-Ken (JP)

( * ) Notice: Subject to any disclaimer, the term of this patent is extended or adjusted under 35 U.S.C. 154(b) by 20 days.

(21) Appl. No.: 10/780,723

(22) Filed: Feb. 19, 2004

(65) Prior Publication Data

US 2004/0164399 A1 Aug. 26, 2004

(30) Foreign Application Priority Data

Feb. 21, 2003 (JP) ............... 2003-044495

(51) Int. Cl.
*H01L 21/00* (2006.01)
(52) U.S. Cl. ............... 438/123; 257/E21.506
(58) Field of Classification Search ......... 438/111, 438/123; 257/E21.499, E21.506
See application file for complete search history.

(56) References Cited

U.S. PATENT DOCUMENTS

| | | | |
|---|---|---|---|
| 6,060,768 A | 5/2000 | Hayashida et al. | |
| 6,071,755 A | 6/2000 | Baba et al. | |
| 6,083,837 A * | 7/2000 | Millet | 438/691 |
| 6,097,087 A * | 8/2000 | Farnworth et al. | 257/698 |
| 6,531,769 B2 | 3/2003 | Yamaguchi | |
| 6,762,502 B1 | 7/2004 | Akram | |
| 6,780,679 B2 | 8/2004 | Ito et al. | |
| 6,784,539 B2 | 8/2004 | Efland | |
| 6,847,103 B1 * | 1/2005 | Perez et al. | 257/676 |
| 6,885,086 B1 * | 4/2005 | Fogelson et al. | 257/666 |
| 2002/0149099 A1 * | 10/2002 | Shirasaka et al. | 257/692 |
| 2003/0178708 A1 | 9/2003 | Minamio et al. | |
| 2003/0193091 A1 | 10/2003 | Yu et al. | |

FOREIGN PATENT DOCUMENTS

| | | |
|---|---|---|
| JP | 9-219463 | 8/1997 |
| JP | 10-144853 | 5/1998 |
| JP | 10-256427 | 9/1998 |

(Continued)

OTHER PUBLICATIONS

Japanese Office Action dated Nov. 29, 2005 (with English translation of relevant portion).

(Continued)

*Primary Examiner*—W. David Coleman
(74) *Attorney, Agent, or Firm*—Dickstein Shapiro LLP

(57) ABSTRACT

A semiconductor device is produced using a lead frame whose size is smaller than a prescribed center area of a semiconductor chip surrounded by its bonding pads, which are connected with electrodes supported by electrode supports and interconnected with outer frames and an intermediate frame of the lead frame via bonding wires. A series of projections and hollows are formed on the outer frames, wherein the electrode supports are interconnected with the hollows of the outer frames respectively. The semiconductor chip combined with the lead frame, is integrally enclosed in a resin under the condition where only the electrode surfaces are exposed to the exterior, thus forming a resin package. Then, the electrode supports locating the electrodes are cut out and partially removed, so that the electrodes are made electrically independent from each other.

9 Claims, 10 Drawing Sheets

FOREIGN PATENT DOCUMENTS

| | | |
|---|---|---|
| JP | 11-150161 | 6/1999 |
| JP | 11-195733 | 7/1999 |
| JP | 2000-286375 | 10/2000 |
| JP | 2000-315700 | 11/2000 |
| JP | 2001-210743 | 8/2001 |
| JP | 2002-190552 | 7/2002 |
| JP | 2003-23133 | 1/2003 |

OTHER PUBLICATIONS

Korean Office Action dated Jan. 31, 2006 (and English translation of same).

* cited by examiner

SEMICONDUCTOR DEVICE HAVING A LEAD FRAME SMALLER THAN A SEMICONDUCTOR CHIP AND MANUFACTURING METHOD THEREFOR

BACKGROUND OF THE INVENTION

1. Field of the Invention

This invention relates to semiconductor devices, and in particular relates to semiconductor devices of the LGA (Land Grid Array) type, in which packages are reduced in sizes to be substantially identical to semiconductor chips. In addition, this invention relates to semiconductor devices of the LGA type in which packages are hardly separated from electrodes connected with external circuits by securing stability in soldering. Furthermore, this invention also relates to manufacturing methods for semiconductor devices of the LGA type.

This application claims priority on Japanese Patent Application No. 2003-44495, the content of which is incorporated herein by reference.

2. Description of the Related Art

In general, semiconductor devices are designed in such a way that semiconductor chips and their electrodes are integrally enclosed (or encapsulated) in resin packages, in which electrodes are partially exposed to the exterior. Conventionally, semiconductor devices are constituted such that electrodes thereof partially and horizontally project from prescribed sides of packages therefor, an example of which is disclosed in Japanese Patent Application Publication No. 2000-286375 (in particular, FIG. 2). To cope with the recent development and demand for downsizing packages and for increasing numbers of terminals extended outside of semiconductor chips, semiconductor devices of the so-called 'LGA' (Land Grid Array) type in which numerous electrodes are arranged in backsides (or mounting surfaces) of package housings are used.

A typical example of a semiconductor chip of the aforementioned LGA type is manufactured as follows:

FIG. 17 shows an example of a lead frame for use in manufacture of the conventional semiconductor device; and FIG. 18 is a cross sectional view showing essential parts of the semiconductor device that is manufactured using the lead frame.

A lead frame 105 shown in FIG. 17 comprises a terminal support member 151 (serving as an outer frame therefor), with which a plurality of inner terminals 102a are arranged internally, and a plurality of outer terminals 102b are arranged externally. In addition, a stage 152 is arranged at the center of the lead frame 105 and is supported by four stage supports 153 that are inwardly elongated from four corners of the lead frame 105.

A semiconductor chip 101 is mounted and fixed onto the stage 152 of the lead frame 105. When the semiconductor chip 101 is mounted in a face-up mode as shown in FIG. 18, pads 101a of the semiconductor chip 101 are connected with backsides of terminals 102 (representing the aforementioned terminals 102a and 102b) via connection fine lines 103. In contrast, when the semiconductor chip 101 is mounted in a face-down mode (not illustrated specifically), the pads 101a of the semiconductor chip 101 are directly connected with the terminals 102 via solder bumps or solder balls.

As described above, the semiconductor chip 101 and the lead frame 105 are connected and assembled together to form a lead frame assembly, which is enclosed (or encapsulated) in a resin package 104 in such a way that electrode surfaces 121 of the terminals 102 connected with an external circuit (not shown) are exposed to the exterior. Next, the electrode surfaces 121 of the terminals 102 and the prescribed parts of the terminal support member 151 exposed to the exterior of the resin package 104 are subjected to polishing and removal in dicing; thus, the inner terminals 102a are separated from the outer terminals 102b. Actually, the manufacturer uses the so-called multiple-connected lead frame assembly in which multiple units of lead frames are interconnected together. Therefore, outer peripheral portions of the outer terminals 102b are subjected to dicing, so that individual semiconductor devices are separated from each other. Reference symbol DG designates a cutting groove that is left after the terminal support member 151 is subjected to polishing and removal.

In the semiconductor device of the LGA type described above, the terminals 102 are partially extended outside of the semiconductor chip 102. For this reason, the overall size of the semiconductor device becomes bigger than the size of the semiconductor chip 101. This does not satisfy the aforementioned demand for downsizing the semiconductor device.

In order to establish connection between the aforementioned semiconductor device and an external circuit, the lower surface (or mounting surface) of the semiconductor device should be soaked into a solder bath so that fillets are formed at the electrodes 121 of the terminals 102 and are brought into tight contact with terminals of the external circuit. At this soldering, the conventional semiconductor device has the following problems.

That is, a terminal surface 123 is exposed to a cut surface 141 formed on the prescribed surface of the package 104, so that the 'exposed' terminal surface 123 is arranged to continuously join the electrode surface 121. Therefore, when the semiconductor device is soaked into the solder bath, solders are continuously formed around the terminal surface 123 continuously joining the electrode surface 121 as shown in FIG. 19A, which causes formation of solder fillets F extended continuously from the electrode surface 121. This causes the amount of solder adhered to the electrode surface 121 become variable; and this therefore causes unwanted dispersion regarding joining strength with the external circuit. In addition, the unstable consumption of solder may bring problems in production management. In soldering, a solder fillet F is elongated to form a bridge across the inner terminal 102a and the outer terminal 102b as shown in FIG. 19B. Alternatively, due to the excessive amount of solder being used, a solder bridge (or solder bridges) may be formed between terminals of the external circuit, which is joined with the semiconductor device. Furthermore, when the semiconductor device is pulled up after being joined with an external circuit 120 as shown in FIG. 19C, the terminals 102 are easy to separate from the package 104.

Actually, the joining strength between the terminal 102 and the package 104 is relatively weak because the terminal 102 is made of a metal, and the package 104 is made of a resin. This produces a possibility that unwanted separation between the terminal 102 and the package 104 may easy occur due to an impact caused by dicing. The aforementioned Japanese Patent Application Publication No. 2000-286375 discloses a solution to this problem, according to which as shown in FIG. 19D, a terminal support member (called a "coupling body" in the publication) is removed from the backside of a package so that terminals (or "connecting pieces") 110 are individually separated from each other, wherein lead-in portions 124 are arranged on prescribed sides of the terminals 110 oppositely to the separated region between the terminals 110 in order to improve adhesion with the package (or a "resin enclosing body"). However, this solution cannot solve the aforementioned problems because the 'exposed' terminal surface of the terminal is still formed continuously with the electrode surface; hence, it is difficult to stabilize the amount of the solder fillet F adhered to the electrode surface and the like, and it is difficult to avoid occurrence of the formation of a bridge (or bridges) due to soldering. In addition, the aforementioned publication is silent in disclosing the formation of the lead-in portions 124 on the face-to-face sides of cut surfaces 141 located in the separated region between the terminals 110, which are individually separated from each other. This cannot make the joining strength between the terminal 110 and the package 104 sufficiently; therefore, when the semiconductor device is pulled up after being joined with the external circuit, it is very difficult to exclude the possibility of the occurrence of separation between the terminal 110 and the package 104.

SUMMARY OF THE INVENTION

It is an object of the invention to provide a semiconductor device including terminals and electrodes connected with an external circuit, wherein the overall size of the semiconductor device is substantially the same as that of a semiconductor chip, thus satisfying the recent demand for downsizing electronic components.

It is another object of the invention to provide a semiconductor device, wherein it is possible to stabilize the amount of solder used for adhesion with regard to terminals and electrodes, it is possible to avoid occurrence of bridges due to soldering, and it is possible to actualize a sufficient anti-separation durability, thus avoiding occurrence of separation of terminals even when the semiconductor device is drawn after being joined with an external circuit.

It is a further object of the invention to provide a manufacturing method for manufacturing the aforementioned semiconductor device.

A semiconductor device of this invention is basically designed such that a semiconductor chip electrically connected with a plurality of electrodes is enclosed (or encapsulated) in a resin package, wherein electrode surfaces formed in the electrodes are exposed to the surface of the resin package and are arranged inwardly from a plurality of bonding pads that are arranged in the outer peripheral portion of the semiconductor chip.

The aforementioned design and structure make the semiconductor device have substantially the same size of the semiconductor chip; hence, it is possible to downsize the semiconductor device.

In addition, solder bumps are attached to the 'exposed' electrode surfaces of the semiconductor device, wherein the total amount of solder being applied to the electrode surfaces can be stabilized; therefore, it is possible to reliably prevent the semiconductor chip from being unexpectedly separated from the resin package.

Furthermore, cutting grooves can be formed by performing half dicing on the prescribed surface of the resin package on which the electrode surfaces are exposed, wherein cut surfaces of electrode supports of a lead frame can be exposed to side walls of cutting grooves, for example.

In the above, cut surfaces of electrode supports can be exposed to 'oppositely arranged' side walls of at least one cutting groove. In addition, cut surfaces of projections and/or hollows, which are formed on outer frames of the lead frame, can be exposed to the bottom of at least one cutting groove.

The aforementioned cutting grooves are formed by partially cutting the electrode supports interconnecting the electrodes, which are thus made electrically independent of each other. Each of the cut surfaces of the electrode supports, which are exposed to the side walls of each cutting groove, are surrounded and covered with a resin and are exposed at prescribed positions, which are lower than the electrode surfaces. This reliably prevents solder from being unexpectedly introduced and joined with the cut surfaces of the electrode supports when solder bumps are formed on the electrode surfaces. That is, it is possible to reliably prevent bridges from being formed across the electrodes and their proximate portions. Therefore, it is possible to stabilize the total amount of solder being consumed, and it is therefore easy for the manufacturer to conduct production management; in other words, it is possible to prevent solder from being wasted in manufacturing. The aforementioned cutting grooves can be filled with an insulating and moisture-proofing resin after the electrode supports are cut out and partially removed.

The manufacturing method for manufacturing the semiconductor device of this invention comprises various steps; namely, a press forming step for forming a lead frame comprising outer frames, a plurality of electrodes arranged inside of the outer frames, and electrode supports; a drawing step for drawing the electrode supports to be lowered in positions compared with the outer frames and electrode surfaces; a step for producing a lead frame assembly for electrically connecting the electrodes interconnected with the electrode supports with the semiconductor chip; an enclosing (or encapsulating) step for enclosing the lead frame assembly with a resin under the condition where the electrode surfaces are exposed; and a cutting step for partially cutting the electrode supports, thus separating the electrodes from each other.

Accordingly, it is possible for the manufacturer to easily produce a semiconductor device whose size is substantially identical to the size of the semiconductor chip, which contributes to downsizing of the semiconductor device.

In addition, the manufacturing method can also provide a plating step for effecting metal plating on the 'exposed' electrode surfaces, and a step for forming solder bumps on the 'metal-plated' electrode surfaces of the semiconductor device, whereby after forming the solder bumps, at least a part of the electrode supports so as to separate the electrodes from each other.

According to the manufacturing method for the semiconductor device described above, it is possible to stabilize the total amount of solder being consumed; and it is therefore easy for the manufacturer to easily produce a semiconductor device that is designed to reliably avoid unwanted separation of the semiconductor chip and the resin package.

In the aforementioned press forming step, it is preferable for each of the outer frames to include a series of projections and hollows, wherein each projection is identical to the electrode surface in height, and each hollow is lowered in position compared with the electrode surface. In addition, it is preferable to form an intermediate frame approximately at the center position between the outer frames oppositely arranged to each other. Thus, it is possible to easily and efficiently form the basic structure of the lead frame.

It is possible to optionally use one of etching, polishing, and press working in the drawing step. Each of these methods actualizes the electrode supports to be easily lowered in positions; therefore, it is possible for the manufacturer to arbitrarily use any one of these methods to suit the facilities.

In the cutting step for separating the electrodes, it is preferable to cut out summits of projections arranged in the outer frames. That is, the manufacturer can collectively separate the electrodes from each other under the stable condition of the semiconductor device that is assembled; therefore, it is possible to efficiently form numerous electrodes to be connected with an external circuit.

BRIEF DESCRIPTION OF THE DRAWINGS

These and other objects, aspects, and embodiments of the present invention will be described in more detail with reference to the following drawings, in which.

DESCRIPTION OF THE PREFERRED EMBODIMENT

This invention will be described in further detail by way of examples with reference to the accompanying drawings. Herein, this invention is not necessarily limited by illustrated examples, which are used to describe the outline of this invention in conjunction with the accompanying drawings, which omit unnecessary elements not required for the explanation of this invention for the sake of convenience. In addition, illustrations are not necessarily drawn accurately so that shapes, numbers, and scales of prescribed elements do not necessarily match those of actual designs and products.

Figure 1:
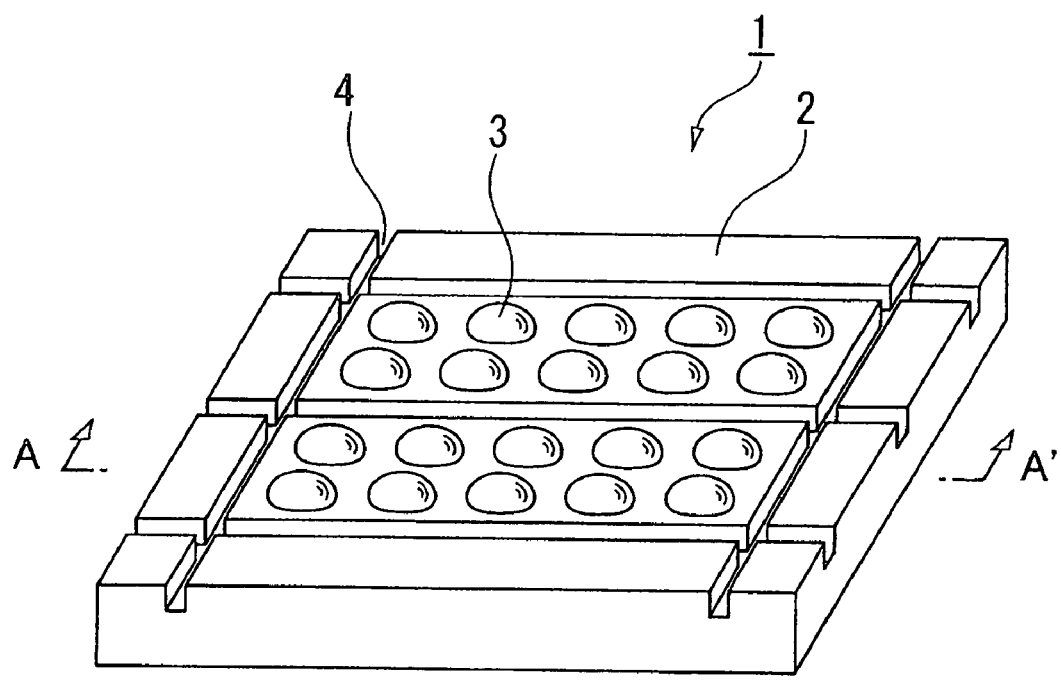
FIG. 1 is a perspective view showing the exterior appearance of a semiconductor device in accordance with a preferred embodiment of the invention.
Figure 2:
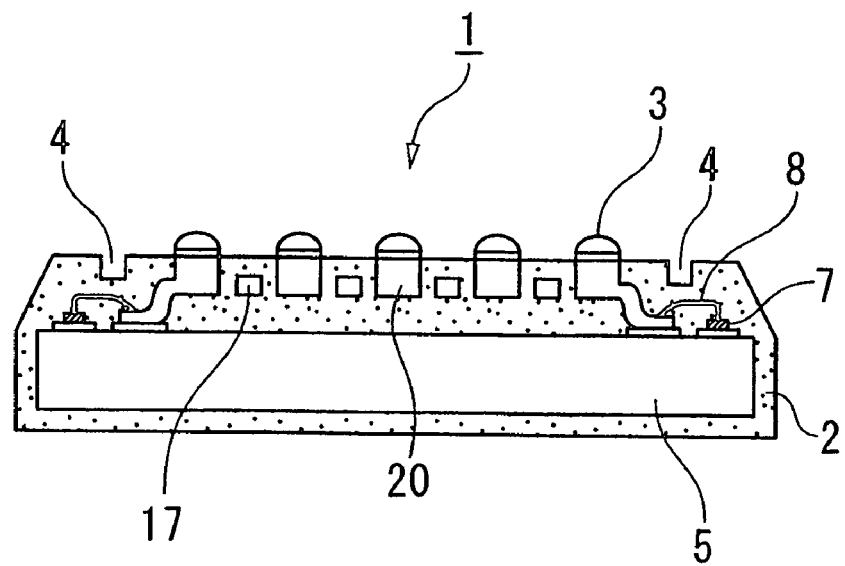
FIG. 2 is a cross sectional view taken along line A–A' in FIG. 1.

FIG. 1 is a perspective view showing the exterior appearance of a semiconductor device in accordance with a preferred embodiment of the invention; and FIG. 2 is a cross sectional view taken along line A–A' in FIG. 1. As shown in FIGS. 1 and 2, bonding pads 7 of a semiconductor chip 5 are connected with electrodes of a lead frame via a bonding wires 8, and the overall structure of the lead frame including the semiconductor chip 5 is encapsulated in a resin 2, wherein electrodes 20 of the lead frame are only exposed to a prescribed surface of the resin 2. As shown in FIG. 1, numerous solder bumps 3 are regularly arranged on a prescribed surface of a semiconductor device 1. In addition, grooves 4 are formed and arranged in a lattice-like manner on the prescribed surface of the semiconductor device 1 on which the electrodes 20 are exposed. As shown in FIG. 2, the 'exposed' electrodes 20 exposed on the prescribed surface of the resin 2 are arranged inwardly (towards the center of the semiconductor chip 5) compared with the bonding pads 7 of the semiconductor chip 5. Such an arrangement of the electrodes 20 will be described later in detail later. It allows a remarkable reduction of the overall size of the semiconductor device 1, which is slightly bigger than the size of the semiconductor chip 5.

According to the semiconductor device 1 of the present embodiment whose cross-sectional structure is shown in FIG. 2, numerous electrode supports 17 are arranged to accompany the electrodes 20 above the semiconductor chip 5, wherein the electrode supports 17 and the electrodes 20 are fixed in the resin 2 such that they are mutually insulated from each other, wherein only the electrodes 20 are partially exposed to the exterior surface of the resin 2. In addition, the solder bumps 3 are formed on the surfaces of the electrodes 20 respectively.

Figure 3:
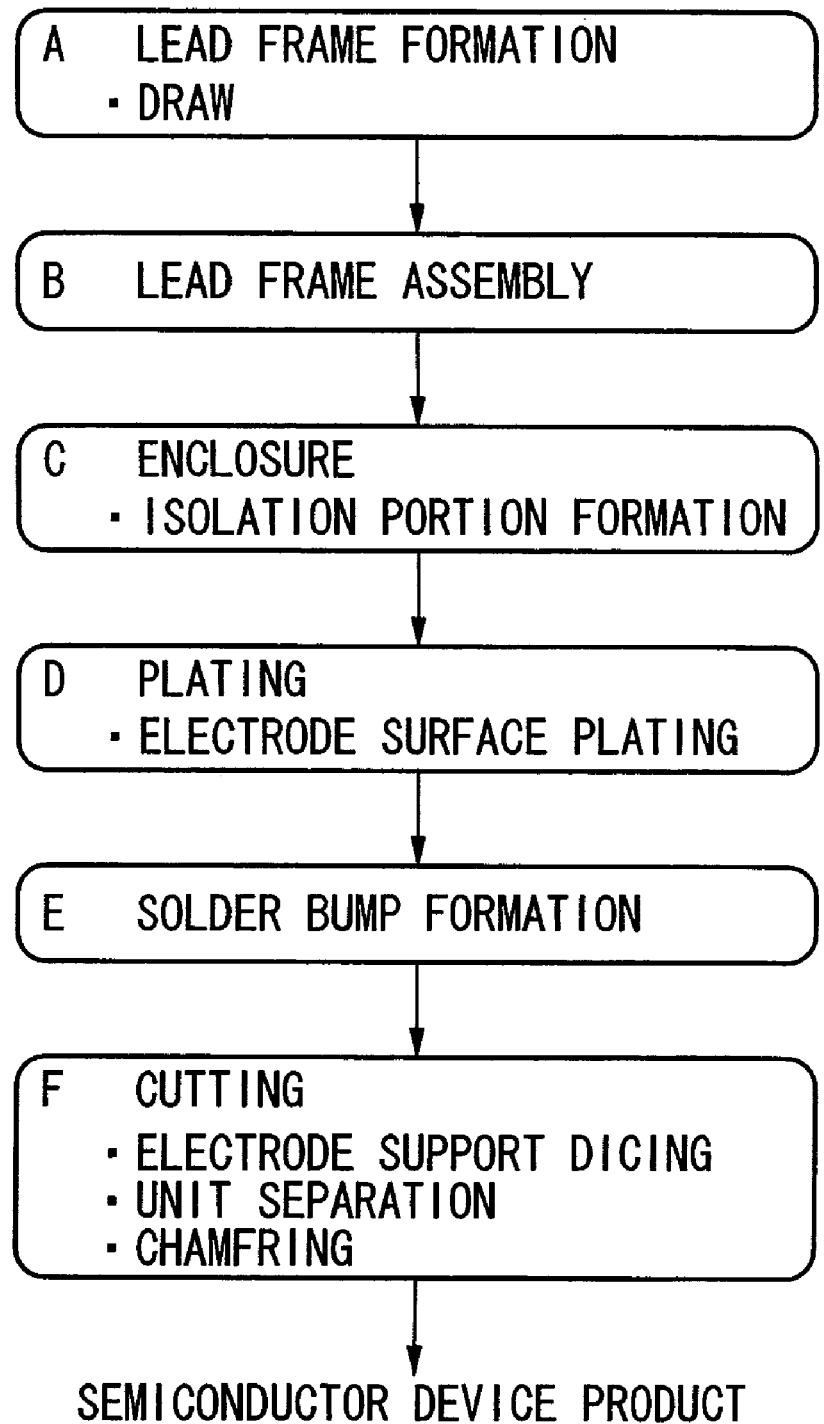
FIG. 3 is a flowchart showing a manufacturing method of the semiconductor device.

Before specifically describing the structure of the semiconductor device 1, a manufacturing method of this invention will be described in detail. That is, the semiconductor device is manufactured by the following steps, which are briefly shown in a flowchart of FIG. 3, namely, a lead frame forming step, a lead frame assembling step, an enclosing (or encapsulating) step, a plating step, a solder bump forming step, and a cutting (or removing) step, which will be described below.

1. Lead Frame Forming Step

Figure 4:
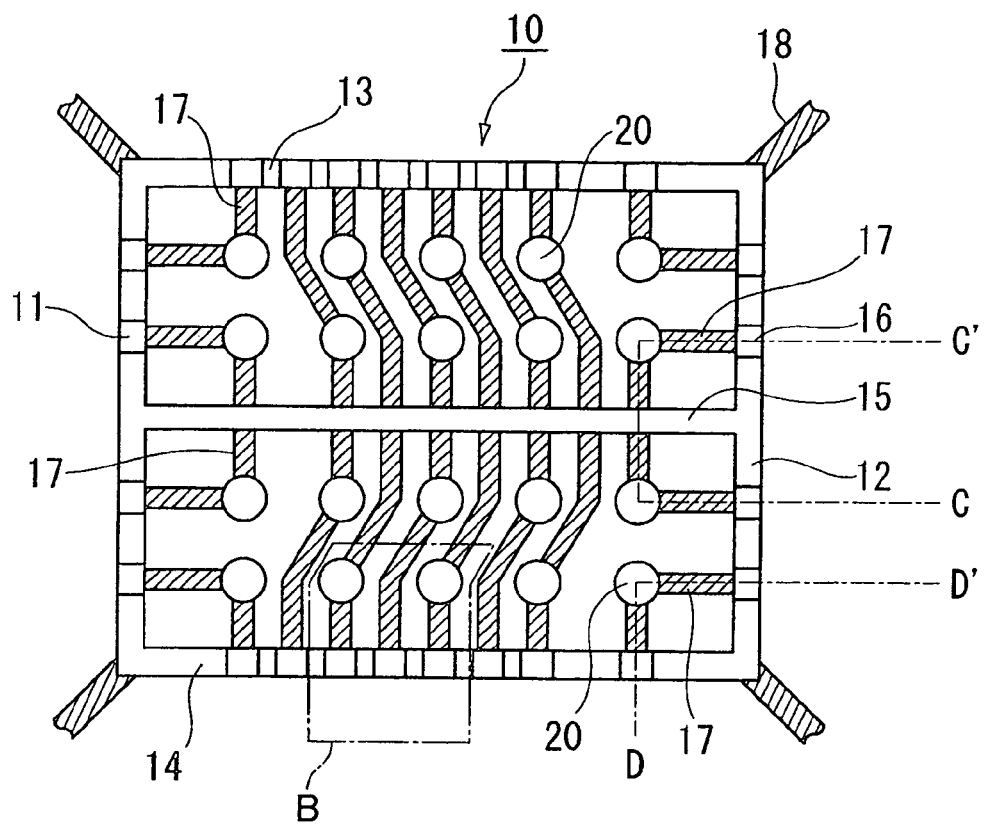
FIG. 4 is a plan view showing a lead frame for use in manufacture of the semiconductor device.

FIG. 4 is a plan view showing a single unit of a lead frame (viewed in the mounting surface side of the semiconductor device) that is formed in the lead frame forming step. Actually, there is provided a multiple-connected lead frame assembly in which numerous units of lead frames each having the same size and shape as shown in FIG. 4 are interconnected together in a plan view. For the sake of convenience, a single unit of the lead frame shown in FIG. 4 will be referred to as a lead frame 10. This lead frame 10 is made using a metal plate having a square outline shape, wherein outer frames 11 and 13 are respectively paired and arranged opposite to each other on four sides. In the case of the lead frame 10 shown in FIG. 4, an intermediate frame 15 is arranged to interconnect together the 'paired' outer frame 11. The numerous electrodes 20 supported by the electrode supports 17 are arranged in regions partitioned by the intermediate frame 15 in the area between the outer frame 13. In the present embodiment, the outer frames 11 and 13, the electrode supports 17, and the electrodes 20 are all electrically connected together and are collectively referred to as electrode portions as necessary.

The aforementioned description is given with respect to a single unit of the lead frame 10. Actually, the manufacturer deals with a multiple-connected lead frame assembly in which multiple lead frames are interconnected together using lead frame interconnecting members 18 arranged at four corners of each lead frame 10.

Next, the lead frame 10 is subjected to a drawing process, in which the surfaces of the electrode supports 17 are drawn to be lower than the surfaces of the outer frames 11 and 13 and the surfaces of the electrodes 20 by one step depth. This can be realized by etching using photolithography, polishing, and press working, for example. In FIG. 4, 'hatching' parts designate 'drawn' portions that are drawn in the drawing process and are lowered in position compared with other parts.

In addition, small hollows are formed at prescribed positions of the outer frames 11 and 13 interconnected with the electrode supports 17; thus, irregularities (or different height portions) are formed along the outer frames 11 and 13 in their overall lengths. Herein, each hollow is further lowered by one step depth compared with the drawn portions. Therefore, press working is preferably used to form the hollows along the outer frames 11 and 13.

Figure 5:
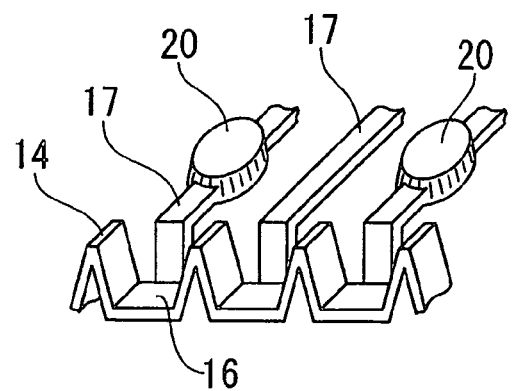
FIG. 5 is an enlarged perspective view magnifying a prescribed part of the lead frame encompassed by dashed lines in FIG. 4.

FIG. 5 is an enlarged perspective view magnifying an area encompassed by dashed lines, thus showing irregularities of the outer frame 13 and its proximate portions. Specifically, the outer frames 11 and 13 are subjected to press working so that they comprise series of projections (or convexities) 14 and hollows 16, which are continuously and alternately arranged. The projections 14 will be finally removed so that electrodes are made to be electrically independent from each other.

The electrode supports 17 are arranged to be elongated from the hollows 16; and the electrodes 20 are formed at prescribed positions of the electrode supports 17. The electrode supports 17 are subjected to drawing so that the surfaces thereof are made slightly lower than the surfaces of the electrodes 20. As shown in FIG. 4, the present embodiment is designed such that the electrodes are aligned in double lines in each of the regions partitioned by the intermediate frame 15 in the area between the outer frames 13, wherein the electrodes 20 are respectively fixed at prescribed positioned in alignment by the electrode supports 17, which are elongated in both sides of the electrodes 20 and are interconnected with the outer frames 11 and 13 and the intermediate frame 15 respectively.

Figure 6:
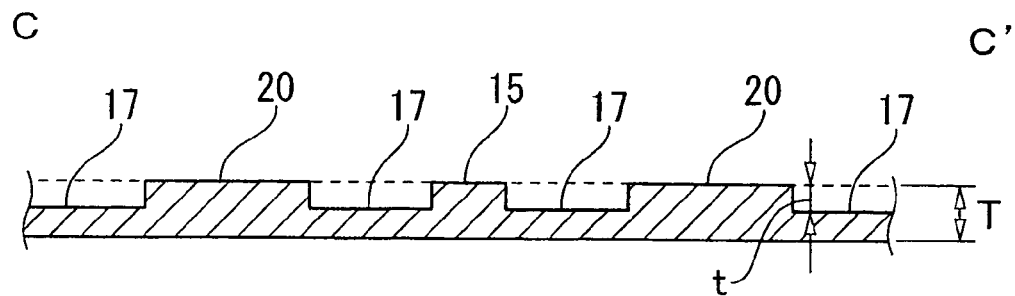
FIG. 6 is a cross sectional view taken along line C–C' in FIG. 4.

FIG. 6 shows a cross-sectional structure cut along a line C–C' (see FIG. 4), which passes through the electrode supports 17 locating the electrodes 20 in both sides of the intermediate frame 15, wherein the surfaces of the intermediate frame 15 and the surfaces of the electrodes 20 are positioned at the same height, while the surfaces of the electrode supports 17 are lowered by one step depth compared with the surfaces of the intermediate frame 15 and the surfaces of the electrodes 20. Herein, one step depth 't' is preferably and roughly set to 50% or so the initial thickness 'T' of the lead frame 10.

Figure 7A:
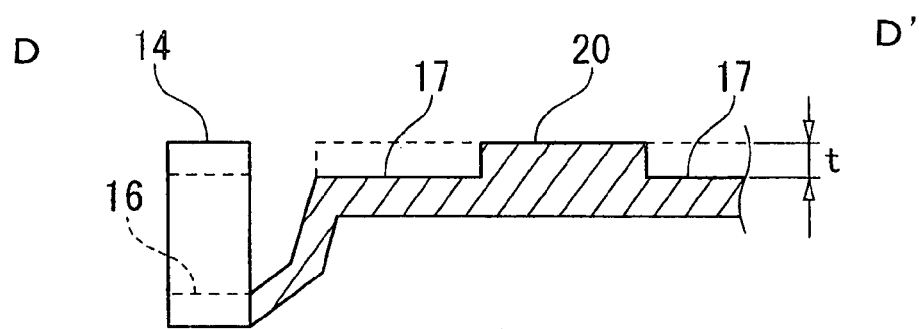
FIG. 7A is a cross sectional view taken along line D–D' in FIG. 4.
Figure 7B:
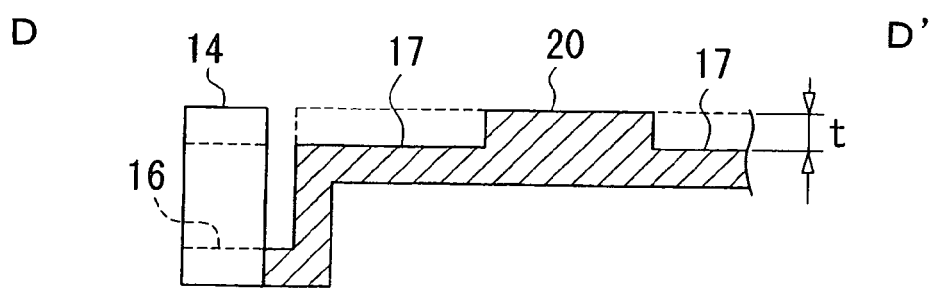
FIG. 7B is a cross sectional view taken along line D–D' in FIG. 4.

FIGS. 7A and 7B show a cross-sectional structure cut along a line D–D' that passes through the electrode supports 17 locating a single electrode 20 and interconnected with the outer frames 11 and 13 at one corner of the lead frame 10, wherein the surface of a projection 14 and the surface of the electrode 20 are positioned at the same height, while the surfaces of the electrode supports 17 are lowered by one step depth 't' compared with the surface of the projection 14 and the surface of the electrode 20. Herein, the electrode supports 17 are interconnected with the prescribed hollows 16 in proximity to the outer frames 11 and 13. It is possible to arrange a slope on the electrode support 17 as shown in FIG. 7A. Alternatively, it is possible to form the electrode support 17 in a crank shape as shown in FIG. 7B.

Figure 8:
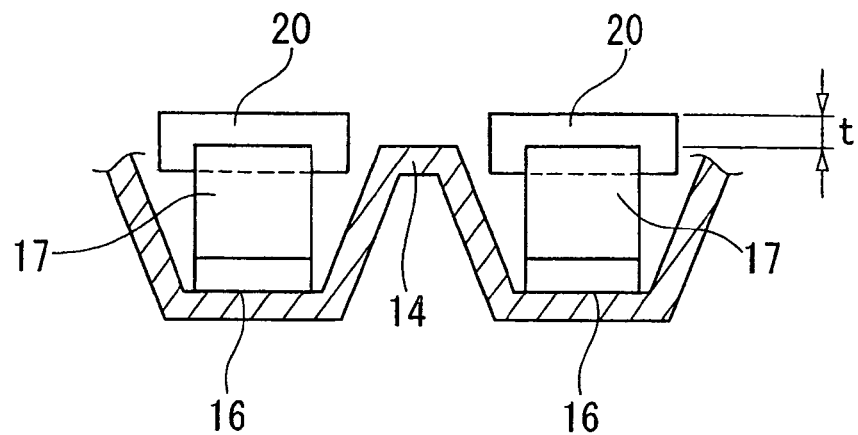
FIG. 8 is a cross sectional view showing another angle of the structure of FIGS. 7A and 7B, which is viewed in the front side.

FIG. 8 shows the aforementioned cross-sectional structure taken along line D–D', which is viewed in the front side. It shows that the projection 14 and the hollows 16 are continuously and alternately arranged, wherein the electrode supports 17 stands from the hollows 16, which are thus interconnected with the electrodes 20. Incidentally, the outer frames 11 and 13, the electrode supports 17, and the electrodes 20 are collectively referred to as electrode portions.

2. Lead Frame Assembling Step

Figure 9:
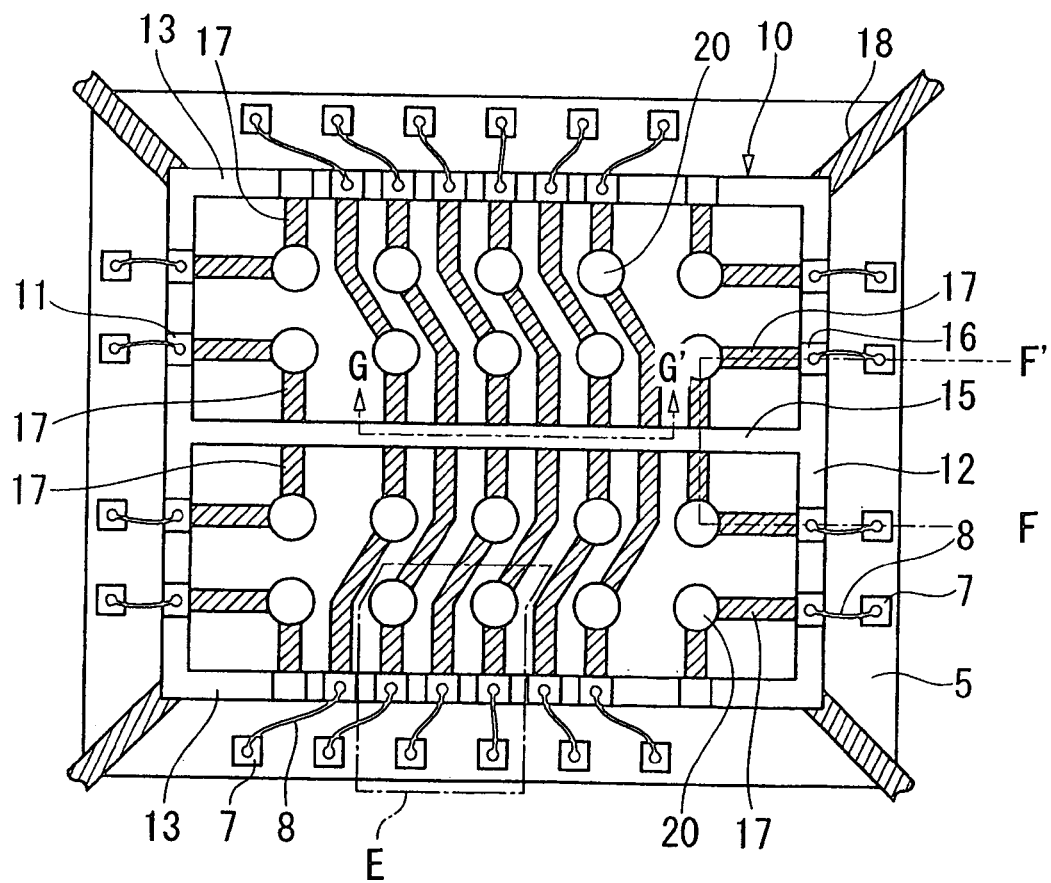
FIG. 9 is a plan view showing the lead frame combined with a semiconductor chip.

The semiconductor chip 5 is bonded onto the lead frame 10, which is processed as described above, in a face-up mode. FIG. 9 is a plan view showing the lead frame 10 combined with the semiconductor chip 5, wherein the lead frame 10 is arranged in a center area surrounded by the bonding pads 7 that are arranged in the outer peripheral portion of the semiconductor chip 5. This arrangement makes the semiconductor device to have the substantially same size of the semiconductor chip 5, which is a final target in development of this invention. The bonding pads 7 of the semiconductor chip 5 are connected with the corresponding hollows 16 within the aforementioned electrode portions of the lead frame 10 via the bonding wires 8. Thus, it is possible to completely produce a lead frame assembly.

Figure 10:
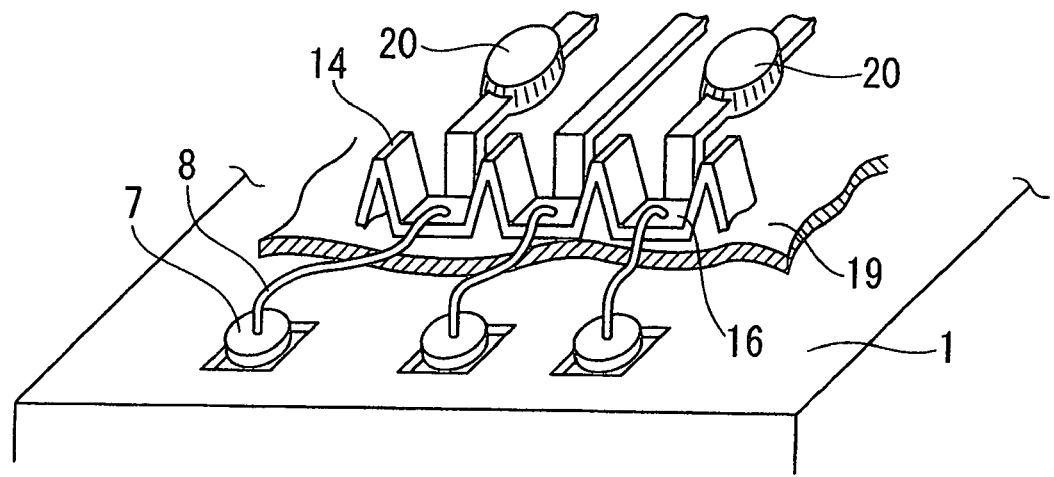
FIG. 10 is an enlarged perspective view magnifying an area encompassed by dashed lines E in FIG. 9.

FIG. 10 is an enlarged perspective view magnifying an area encompassed by dashed lines E in FIG. 9, which includes irregularities of the outer frame 13 and their proximate portions.

As shown in FIG. 10, the projections 14 and the hollows 16 are continuously and alternately arranged in the outer frame 13, wherein the electrode supports 17 locating the electrodes 20 are elongated from the hollows 16 respectively. Herein, the hollows 16 are respectively connected with the bonding pads 7 of the semiconductor chip 5 via the bonding wires 8. The lower surfaces of the hollows 16 are mounted on the semiconductor chip 5 by the intervention of an insulating tape 19.

3. Enclosing (or Encapsulating) Step

The aforementioned lead frame assembly (actually, the multiple-connected lead frame assembly) is installed in split molds providing a cavity, into which a melted resin is introduced and is then hardened. Thus, it is possible to form a series of packages communicated with multiple units of lead frames respectively. In this enclosing step, the resin is filled into spaces that are formed by drawing electrode interconnecting members, around which the resin is hardened.

Then, a series of hardened materials are extracted from the split molds so as to obtain a continuous body of multiple units of semiconductor devices, wherein the surfaces of the electrodes 20 of the respective units are exposed to the mounting surfaces of the semiconductor devices.

4. Plating Step

Next, metal plating is effected onto the mounting surfaces of the semiconductor devices. Actually, it preferably uses a low melting point alloy such as Sn—Pb alloy, Sn—Bi alloy, and Sn—Cu alloy. Using such an alloy, plated layers are adequately formed on the exposed surfaces of the electrodes 20.

5. Solder Bump Forming Step

Next, the plated layers that are formed on the exposed surfaces of the electrodes 20 are heated and melted so that the low melting point alloy is spheroidized to form bumps. Alternatively, prescribed solvent is applied to the surfaces of the plated layers, toward which solder bumps are pressed under heating, thus forming solder bumps.

6. Cutting Step

Figure 11:
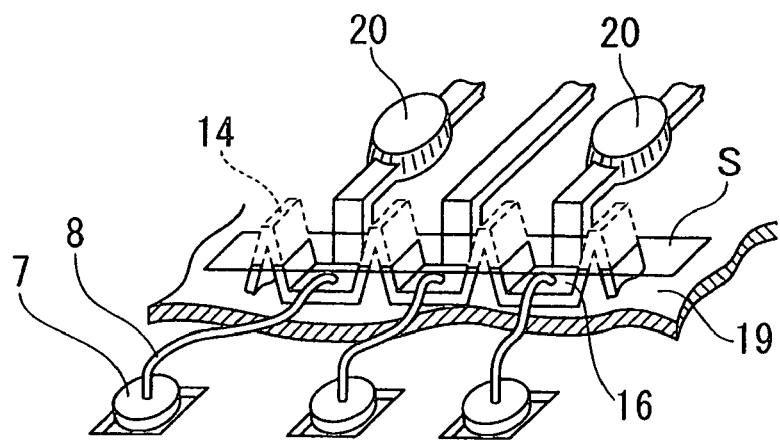
FIG. 11 is an enlarged perspective view showing prescribed parts of the semiconductor device that is being subjected to cutting.

With respect to the continuous body of multiple units of semiconductor devices, cutting grooves 4 are formed along the outer frames 11 and 13 and the intermediate frame 15 shown in FIG. 9. FIG. 11 is an enlarged perspective view showing the appearance of a prescribed part of the semiconductor device that is subjected to cutting, wherein cutting is performed along with the outer frames 11 and 13. Specifically, half dicing is performed to the level designated by a plane S in FIG. 11 so that the projections 14 of the outer frames 11 and 13 are partially subjected to dicing.

FIG. 11 does not specifically illustrate the intermediate frame 15, which is removed upon half dicing, so that electrode interconnecting members are separated from each other.

Figure 12:
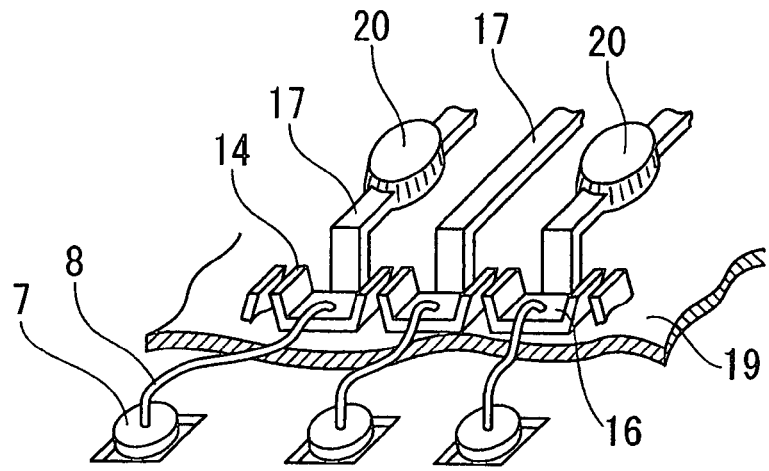
FIG. 12 is an enlarged perspective view showing prescribed parts of the semiconductor device after cutting.

Thus, it is possible to mutually separate the hollows 16 as shown in FIG. 12, whereby electrode portions are independently separated from each other.

Figure 13:
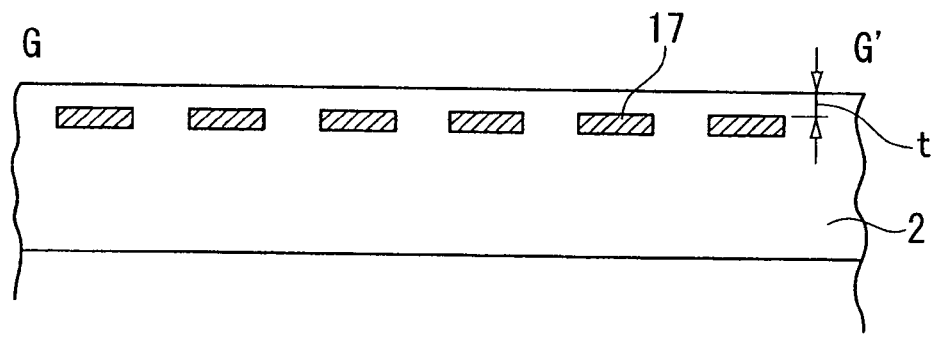
FIG. 13 is a cross sectional view taken along line G–G' in FIG. 9, which diagrammatically shows the side wall of a cutting groove formed through an intermediate frame shown in FIG. 9.

FIG. 13 is a cross sectional view taken along line G–G' in FIG. 9, which diagrammatically shows the side wall of a cutting groove formed through the intermediate frame 15. That is, cut surfaces of the electrode supports 17 are continuously arranged and exposed to both of the side walls of the cutting groove that is formed through the intermediate frame 15. The four sides of the cut surface of each electrode support 17 are covered and encompassed by the aforementioned resin 2, wherein the upper side of each electrode support 17 is lowered from the surface of the resin 2 by a prescribed depth 't'. Since the semiconductor device is connected with an external circuit under the condition where each of the electrode supports 17 is securely held and surrounded by the resin 2, it is possible to reliably prevent the electrodes 20 from being separated from the resin 2 even when the semiconductor device is drawn by an external force.

Figure 14:
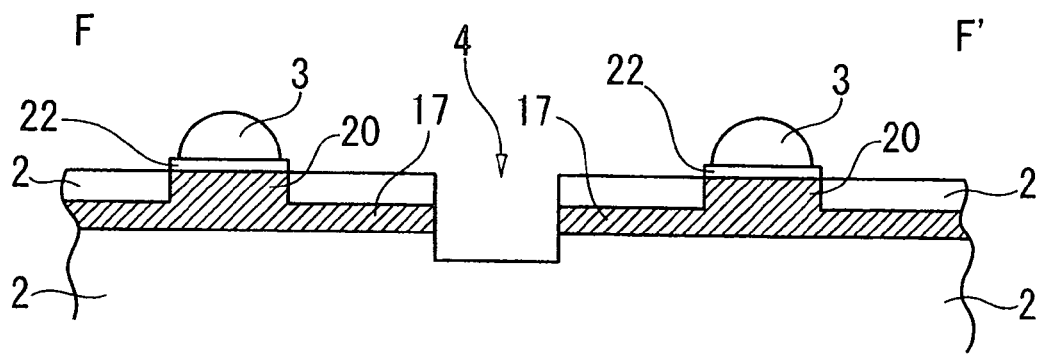
FIG. 14 is a cross sectional view taken along line F–F' in FIG. 9.

FIG. 14 provides a similar illustration of FIG. 6 and is a cross sectional view taken along line F–F' that passes through the electrode supports 17 locating the electrodes 20 on both sides of the intermediate frame 15 shown in FIG. 9, wherein the intermediate frame 15 is subjected to half dicing so that a cutting groove 4 is correspondingly formed. Herein, solder bumps 3 are formed on the surfaces of the electrodes 20, which are exposed to the surface(s) of the resin 2, via plated layers 22.

Figure 15:
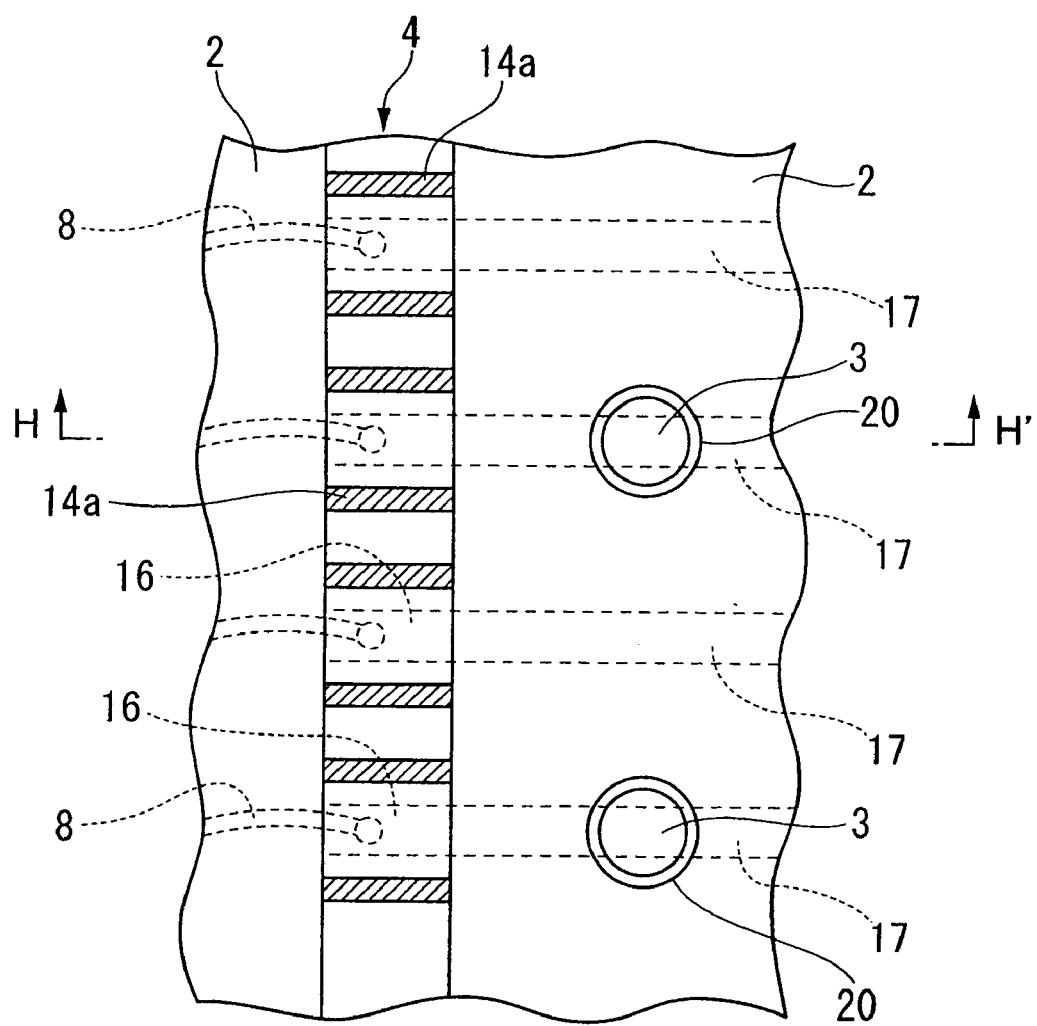
FIG. 15 is a plan view showing a cutting groove that is formed along an outer frame of the lead frame shown in FIG. 9.

FIG. 15 is a plan view showing a cutting groove 4 that is formed on each of the outer frames 11 and 13. As described above, the cutting groove 4 is formed by half dicing so that the projections 14 of the outer frames 11 and 13 are cut out and removed. Therefore, no element is exposed on the side walls of the cutting groove 4 formed along each of the outer frames 11 and 13, whereas only cut surfaces 14a that are left after the projections 14 are cut out are exposed on the bottom of the cutting groove 4. All of the electrode supports 17, the hollows 16, and the bonding wires 8 are embedded in the resin 2.

Figure 16:
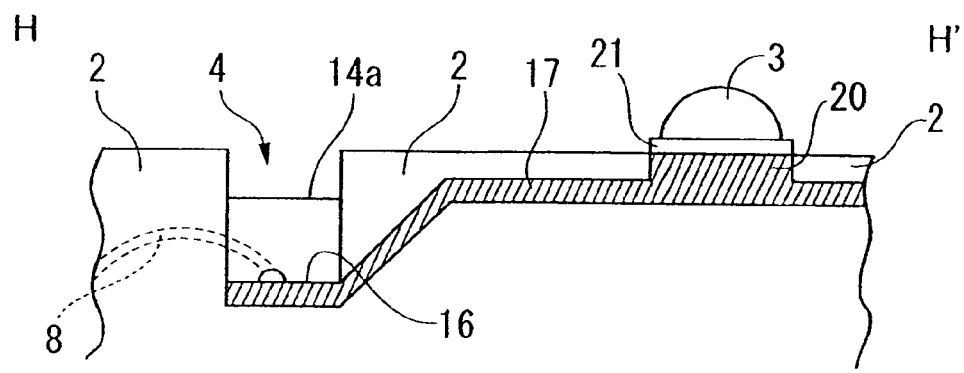
FIG. 16 is a cross sectional view taken along line H–H' in FIG. 15.
Figure 17:
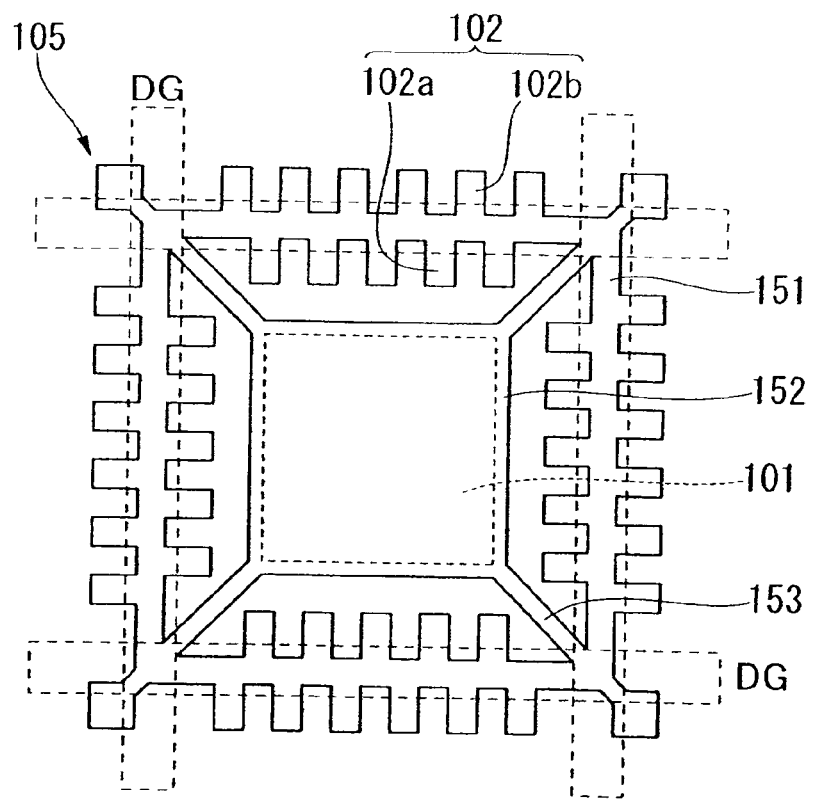
FIG. 17 is a plan view showing the conventionally-known example of a lead frame for use in manufacture of a semiconductor device.
Figure 18:
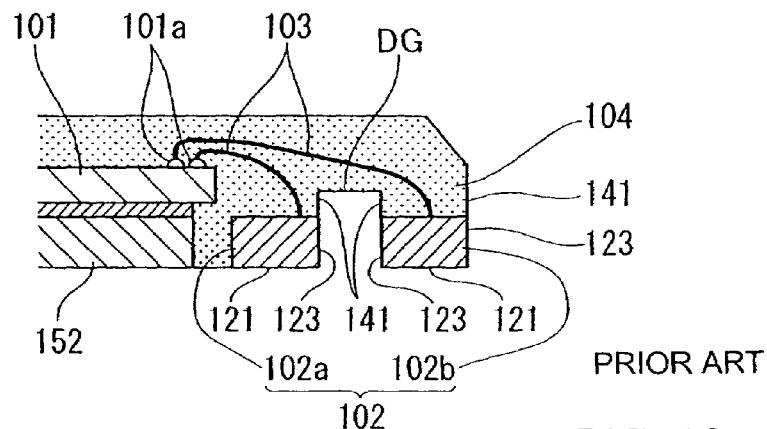
FIG. 18 is a cross sectional view showing essential parts of the semiconductor device that is manufactured using the lead frame of FIG. 17.
Figure 19A:
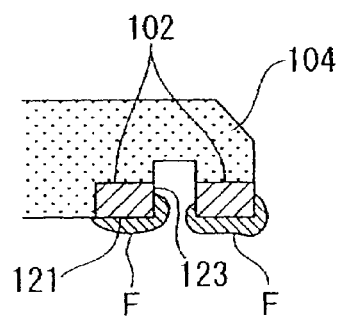
FIG. 19A is a cross sectional view showing essential parts of a semiconductor device in which solder fillets are formed to continuously cover electrode surfaces and terminal surfaces.
Figure 19B:
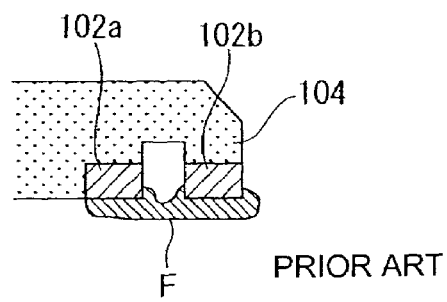
FIG. 19B is a cross sectional view showing essential parts of a semiconductor device in which a solder fillet is formed to produce a bridge across adjoining terminals.
Figure 19C:
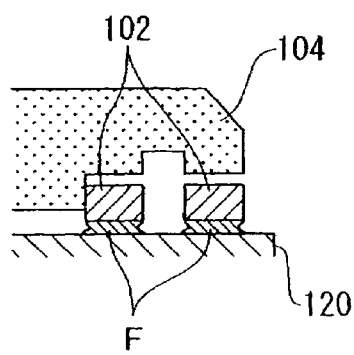
FIG. 19C is a cross sectional view showing essential parts of a semiconductor device in which terminals are separated from a package which is drawn by an external force.
Figure 19D:
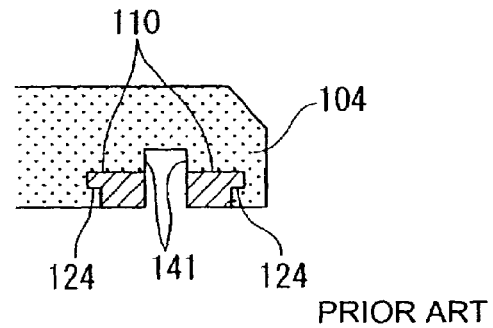
FIG. 19D is a cross sectional view showing essential parts of a semiconductor device in which lead-in portions are formed to project from prescribed sides of terminals in order to increase adhesion between terminals and a package.

FIG. 16 is a cross sectional view taken along line H–H' in FIG. 15, and it shows a cross-sectional structure in which the aforementioned elements are embedded in the resin 2. As shown in FIG. 16, the depth of the cutting groove 4 is stopped at the cut surface 14a of the projection 14, whereby all of the electrode supports 17, the hollows 16, and the bonding wires 8 are completely embedded in the resin 2, whereas only the electrodes 20 are partially exposed to the surface of the resin 2, and the solder bump 3 is formed on the surface of the electrode 20 via the plated layer 22.

As described above, the semiconductor device of the present embodiment is designed in such a way that only the electrode surfaces are exposed to the surface of the resin, wherein the cut surfaces of the electrode interconnecting members exposed to the cutting grooves formed in the resin are surrounded by the resin and are prevented from being continuously joined with the electrode surfaces. This reliably prevents solder bridges from being formed across the electrode surfaces and the cut surfaces of the electrode interconnecting members during the formation of plated layers. In addition, it is possible to stabilize the total amount of solder being consumed, and it is therefore easy for the manufacturer to conduct production management.

Incidentally, the aforementioned cutting grooves formed in the resin can be left as they are. Alternatively, it is possible to fill cutting grooves with an insulating and moisture-proofing resin after the electrode interconnecting members are separated from each other. Since the cut surfaces of the electrode interconnecting members are enclosed with a resin, it is possible to improve dust-protecting and moisture-proofing property in the semiconductor device; thus, it is possible to guarantee a further stable operation in the semiconductor device.

Moreover, it is possible to form either solder bumps or solder balls on the electrode surface of the semiconductor device. In addition, the material for use in formation of bumps or balls is not necessarily limited to solder, which can be replaced with gold, silver, copper, or an alloy including at least two elements selected from among gold, silver, and copper, or a conductive polymer, for example.

As described heretofore, this invention has a variety of effects and advantages, which will be described below.

(1) A semiconductor device of this invention is characterized in that electrodes connected with an external circuit are arranged inside of a peripheral arrangement of bonding pads of a semiconductor chip. This makes the overall size of the semiconductor device substantially the same as the size of the semiconductor chip. Therefore, it is possible to easily attain downsizing of the semiconductor device.

(2) The semiconductor device is designed to prevent electrode surfaces from being continuously joined with cut surfaces of electrode interconnecting members. This reliably prevents solder bridges from being formed across electrodes and electrode interconnecting members. Therefore, it is possible to stabilize the total amount of solder being consumed; and it is therefore easy for a manufacturer to conduct production management.

(3) Since all the electrode interconnecting members are embedded in a resin for enclosing essential parts of the semiconductor device including a semiconductor chip, it is possible to noticeably improve the joining strength between the electrodes and the resin package; therefore, it is possible to reliably prevent the electrodes from being separated from the resin package even when the semiconductor device is pulled up/down or drawn.

As this invention may be embodied in several forms without departing from the spirit or essential characteristics thereof, the present embodiment is therefore illustrative and not restrictive, since the scope of the invention is defined by the appended claims rather than by the description preceding them, and all changes that fall within metes and bounds of the claims, or equivalents of such metes and bounds are therefore intended to be embraced by the claims.

What is claimed is:

1. A manufacturing method for a semiconductor device comprising the steps of:
pressing a metal material to produce a lead frame that comprises a plurality of outer frames, a plurality of electrode supports connected with the plurality of outer frames, and a plurality of electrodes respectively supported by the plurality of electrode supports;
drawing the plurality of electrode supports to be lowered in position compared with surfaces of the electrodes and at least a part of the outer frames;
forming a lead frame assembly in which a semiconductor chip is electrically connected with the plurality of electrodes;
enclosing the lead frame assembly within a resin package in such a way that the surfaces of the electrodes are exposed to a surface of the resin package; and
cutting at least a prescribed part of the electrode supports so as to separate the plurality of electrodes from each other, wherein the plurality of electrode supports and the plurality of electrodes are within an area defined by outer frame, said outer frame being smaller than said semiconductor chip.

2. The manufacturing method for a semiconductor device according to claim 1 further comprising the steps of:
effecting metal plating on the exposed surfaces of the electrodes respectively; and
forming a plurality of bumps or balls on the plated surfaces of the electrodes.

3. The manufacturing method for a semiconductor device according to claim 1, wherein the lead frame is subjected to press working so that a plurality of irregularities comprising a series of projections and hollows are formed along at least one outer frame, and wherein each of the projections is positioned at a height substantially matching the surface of each electrode, and each of the hollows is positioned at a height which is lower than the surface of each electrode.

4. The manufacturing method for a semiconductor device according to claim 1, wherein the lead frame further comprises an intermediate frame substantially positioned at a center of an area defined by the outer frames.

5. The manufacturing method for a semiconductor device according to claim 1, wherein the plurality of electrode supports are drawn in position in accordance with one of etching, polishing, and press working.

6. The manufacturing method for a semiconductor device according to claim 2, wherein after the plurality of bums or balls are formed on the plated surfaces of the electrodes, the prescribed part of the electrode supports are cut out so that the plurality of electrodes are separated from each other.

7. The manufacturing method for a semiconductor device according to claim 2, wherein the plurality of bumps or balls are each made of solder, gold, silver, copper, or an alloy including at least two elements selected from among gold, silver, and copper, or an conductive polymer.

8. The manufacturing method for a semiconductor device according to claim 3, wherein the electrode supports are subjected to cutting such that summit portions of the projections arranged along the outer frame are cut out.

9. A manufacturing method for a semiconductor device comprising the steps of:
pressing a metal material to produce a lead frame that comprises a plurality of outer frames, a plurality of electrode supports connected with the plurality of outer frames, and a plurality of electrodes respectively supported by the plurality of electrode supports;
drawing the plurality of electrode supports to be lowered in position compared with surfaces of the electrodes and at least a part of the outer frames;
forming a lead frame assembly in which a semiconductor chip is electrically connected with the plurality of electrodes, said outer frame being smaller than said semiconductor chip;
enclosing the lead frame assembly within a resin package in such a way that the surfaces of the electrodes are exposed to a surface of the resin package; and
cutting at least a prescribed part of the electrode supports so as to separate the plurality of electrodes from each other.

* * * * *